US006605997B1

(12) United States Patent
Hanson et al.

(10) Patent No.: US 6,605,997 B1
(45) Date of Patent: Aug. 12, 2003

(54) CMOS DUAL-STAGE DIFFERENTIAL RECEIVER-AMPLIFER

(75) Inventors: Charles C. Hanson, Kenyon, MN (US); Curtis Walter Preuss, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/071,170

(22) Filed: Feb. 8, 2002

(51) Int. Cl.[7] ................................................. H03F 3/45
(52) U.S. Cl. ..................................................... 330/253
(58) Field of Search ................................ 330/253, 258, 330/261, 295; 327/563

(56) References Cited

U.S. PATENT DOCUMENTS

| 4,958,133 A | | 9/1990 | Bazes |
| 5,323,120 A | * | 6/1994 | Ryat ........................ 330/261 X |
| 5,714,906 A | * | 2/1998 | Motamed et al. ........... 327/563 |

* cited by examiner

Primary Examiner—Steven J. Mottola
(74) Attorney, Agent, or Firm—Bracewell & Patterson, L.L.P.

(57) ABSTRACT

A differential receiver-amplifier having reduced input distortion at differential input (positive and negative) terminals to the differential receiver-amplifier. The output from the differential receiver-amplifier is generated from a differential signal detector receiving each differential input from one of a pair of differential amplifiers. While each of the differential amplifiers have two differential input terminals of substantially different input impedances, the first differential input terminal of the first differential amplifier and the second differential input terminal of the second differential amplifier are coupled to the differential positive terminal, and the second differential input terminal of the first differential amplifier and the first differential input terminal of the second differential amplifier are coupled to the differential negative terminal, wherein the resulting input impedance at the differential positive terminal is substantially equal to the resulting input impedance at the differential negative terminal.

8 Claims, 3 Drawing Sheets

CMOS DUAL-STAGE DIFFERENTIAL RECEIVER-AMPLIFER

BACKGROUND OF THE INVENTION

1. Technical Field

The present invention relates in general to communication receivers, and in particular to CMOS differential amplifier-receivers.

2. Description of the Related Art

Differential amplifier-receivers receive two input signals and produce an output signal that is a function of the difference in values of the two input signals. Differential amplifiers are used to amplify analog, as well as digital signals, and can be used in various implementations to provide an output from the amplifier in response to differential inputs. They can be readily adapted to function as an operational amplifier, a comparator, a sense amplifier and as a front-end buffer stage for another circuit. One type of differential amplifier employs Complimentary metal-oxide semiconductor (CMOS) integrated circuits. CMOS differential amplifiers are frequently used as communication receivers in systems with large inter-connection distances. CMOS differential amplifiers are particularly useful in these environments because of their strong capabilities in common-mode, low voltage, and high speed operation.

A common technique for improving the common-mode input range of a CMOS differential amplifier is to include a self-bias feature such as that described in U.S. Pat. No. 4,958,133, issued to Bazes, which discloses complimentary pairs of transistors that are symmetrically configured. A strong common-mode rejection is provided because of the self-biasing scheme. This provides an extended range of common-mode input voltages, but at the same time provides a high gain in differential-mode amplification. Because of the biasing scheme, negative feedback is provided internally within the amplifier to provide the low sensitivity to variations.

However, a performance problem arises when using a CMOS complimentary self-bias differential amplifier as a differential receiver. This problem is seen by reviewing the well-established and commonly used circuit design for a CMOS complimentary self-biased differential amplifier. The typical design has complementary input signal paths having corresponding symmetrical transistors matched to have the same characteristics. The primary difference between the symmetrical paths is that one input of the differential input pair is coupled to the drains of the common-bias circuit, which have very little voltage swing when an input differential is applied, and the second differential input is coupled to the drains of the output driver, which has a relatively large voltage swing.

As will be appreciated by those skilled in the art, the large voltage swings on the output have a feedback effect (known as the "Miller effect") through the drain of the input transistor that influences the input impedance for that differential input. As is well known in the art, the "Miller effect" is the deterioration of the effective input impedance caused by the presence of feedback from the output port to the input port of a phase-inverting voltage amplifier. In contrast, the differential input coupled to the common-bias circuit has a small amount of input impedance from the Miller Effect. This results in a mismatch of input impedance at the differential input pairs that can create a substantial distortion effect at the output of the amplifier. When the differential amplifier is used in a receiver, the distortion becomes more pronounced in high-speed communications because of the long distance from the signal source, the high frequency of digital communications, and the low voltage operation. The resulting distortion from the mismatch of input impedance between the differential inputs has a substantial negative effect on the receiver performance. Consequently, there is a need for a communications amplifier-receiver that reduces signal distortion induced by mismatched differential input impedance seen in common-mode differential amplifier-receivers.

SUMMARY OF THE INVENTION

In accordance with a preferred embodiment, a differential receiver-amplifier having reduced input distortion is provided. The differential receiver-amplifier receives differential data signals at differential terminals, and includes a differential signal detector having a first input terminal and a second input terminal, wherein an output signal is produced on an output terminal when a differential signal is detected on the first and second input terminals, a first differential amplifier having an output terminal coupled to the first input terminal, the first differential amplifier comprising a first differential input terminal and a second differential input terminal, wherein an input impedance at the first differential input terminal of the first differential amplifier is substantially different than an input impedance of the second differential input terminal of the first differential amplifier at an input frequency of interest, and a second differential amplifier having an output terminal coupled to the second input terminal, the second differential amplifier comprising a first differential input terminal and a second differential input terminal, wherein an input impedance at the first differential input terminal of the second differential amplifier is substantially different than an input impedance of the second differential input terminal of the second differential amplifier at an input frequency of interest, wherein, the first differential input terminal of the first differential amplifier and the second differential input terminal of the second differential amplifier are coupled to the differential positive terminal, and the second differential input terminal of the first differential amplifier and the first differential input terminal of the second differential amplifier are coupled to the differential negative terminal, wherein the resulting input impedance at the differential positive terminal is substantially equal to the resulting input impedance at the differential negative terminal.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
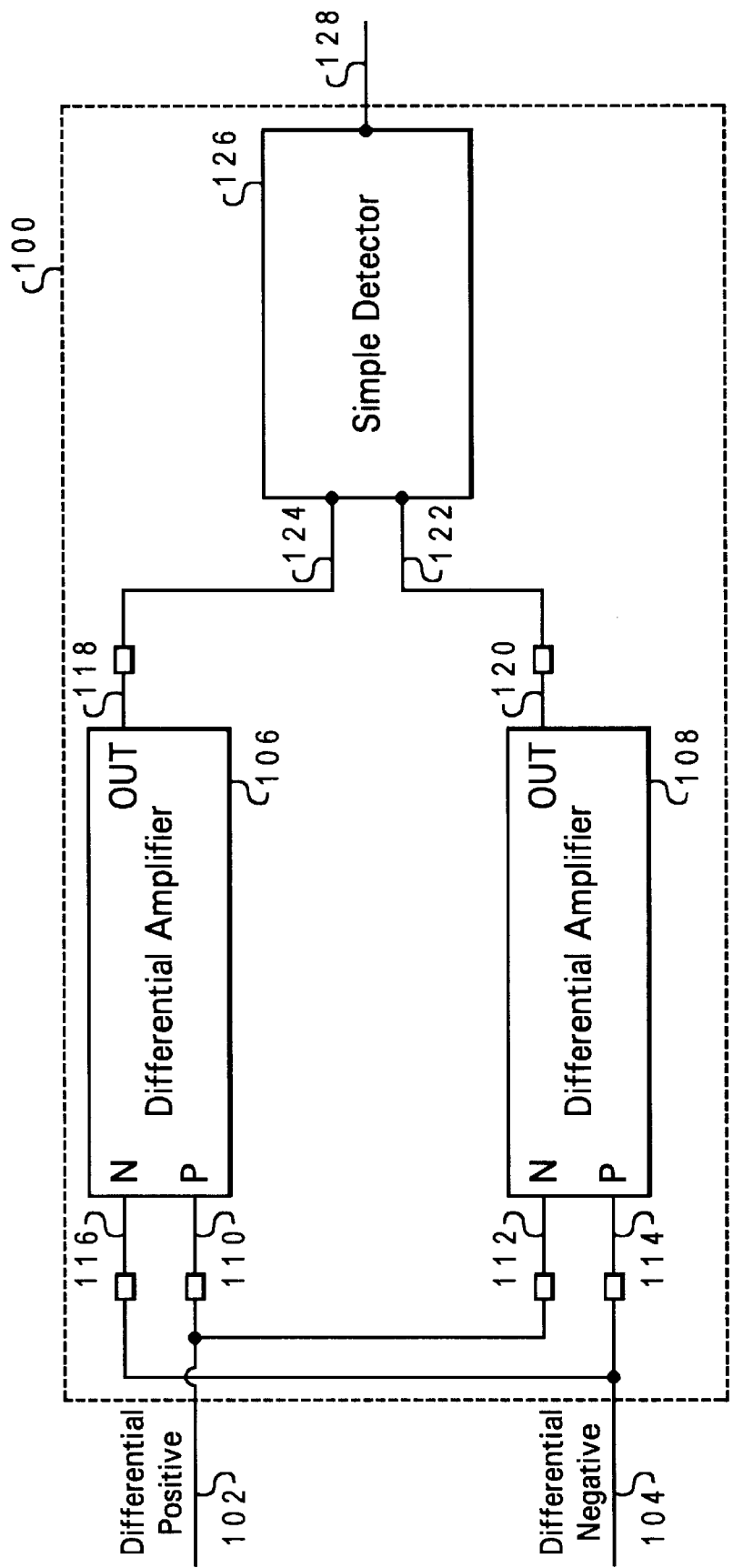
FIG. 1 depicts a block diagram of a dual-stage differential receiver-amplifier, ri in accordance with the preferred embodiment of the present invention.

With reference now to the figures, and in particular with reference to FIG. 1, there is shown a block diagram of a dual-stage differential receiver-amplifier, in accordance with the preferred embodiment of the present invention. Receiver 100 receives a digital differential signal at differential positive terminal 102 and differential negative terminal 104. The differential positive terminal 102 is electrically connected to the positive input 110 of differential amplifier 106 and the negative input 112 of differential amplifier 108. The differential negative terminal 104 is electrically connected to the positive input 114 of differential amplifier 108 and the negative input 116 of differential amplifier 106. Output 118 of differential amplifier 106 is connected to a first input 124 of simple detector 126, and output 120 of differential amplifier 108 is connected to a second input 122 of simple detector 126. The output of simple detector 126 is an output 128 of receiver 100.

Figure 2:
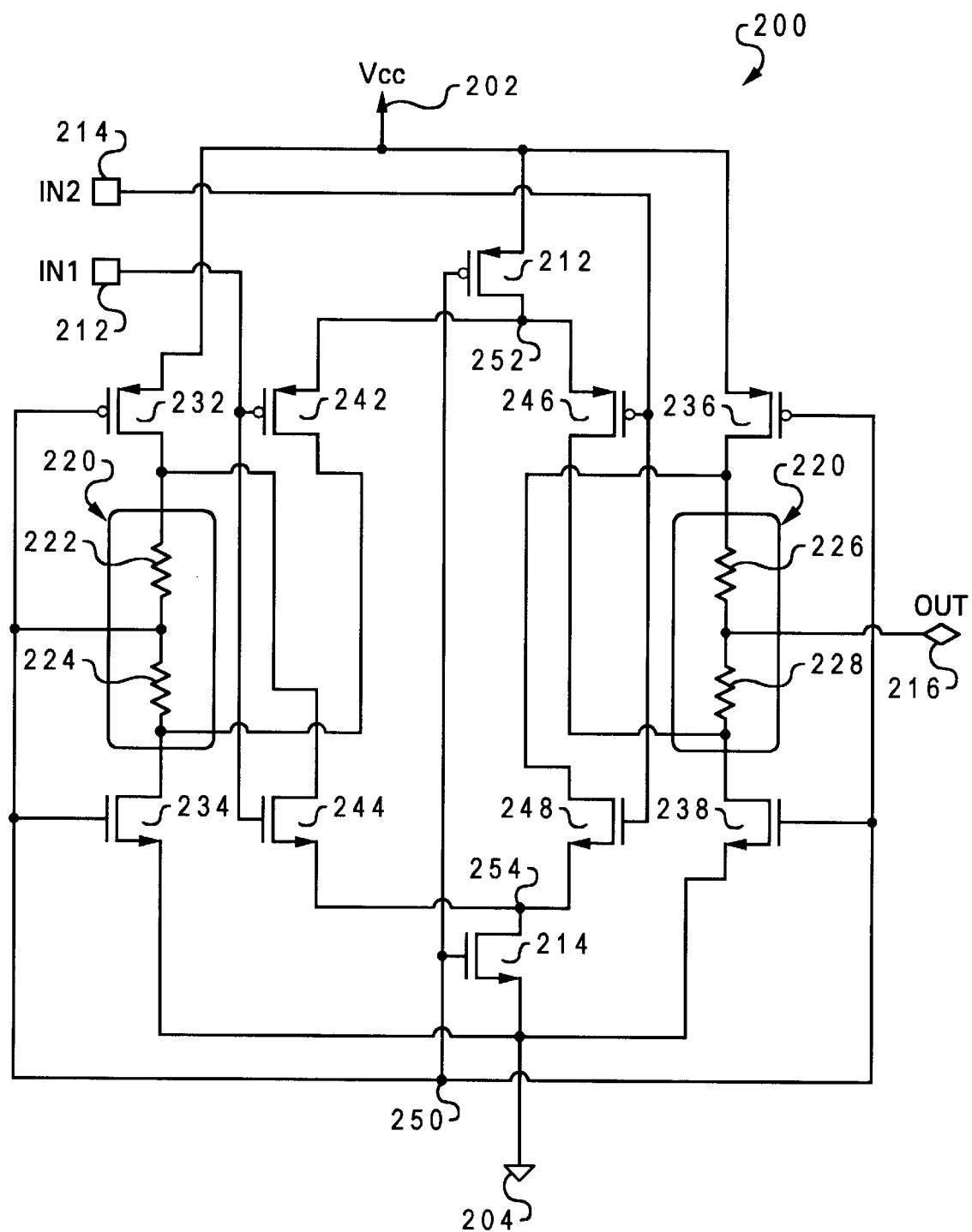
FIG. 2 shows a depiction of a differential amplifier circuit suitable for use in the dual-stage differential receiver-amplifier, in accordance with a preferred embodiment of the present invention.

FIG. 2 shows a representative CMOS differential amplifier circuit 200 that is suitable for use in receiver 100 as differential amplifiers 106, 108. Differential amplifier 200 allows a large common-mode input range as a result of the CMOS complimentary self-biased configuration. Amplifier circuit 200 includes a first transistor 232 that has a first source electrically coupled to the first voltage 202, a first gate electrically coupled to a first node 250 and a first drain. Node 250 is a bias node. The circuit 200 also includes a second transistor 234 that has a second drain, a second gate electrically coupled to the first node 250 and a second source electrically coupled to the second voltage 204. A third transistor 236 has a third source electrically coupled to the first voltage 202, a third drain and a third gate electrically coupled to the first node 250. A fourth transistor 238 has a fourth drain, a fourth gate electrically coupled to the first node 250 and a fourth source electrically coupled to the second voltage 204. A fifth transistor 212 has a fifth source electrically coupled to the first voltage 202, a fifth drain electrically coupled to a second node 252 and a fifth gate electrically coupled to the first node 250. A sixth transistor 214 has a sixth drain electrically coupled to a third node 254, a sixth gate electrically coupled to the first node 250 and a sixth source electrically coupled to the second voltage 204. A seventh transistor 242 has a seventh source electrically coupled to the second node 252, a seventh drain electrically coupled to the second drain, and a seventh gate electrically coupled to a first input signal 212. An eighth transistor 244 has an eighth drain electrically coupled to the first drain, and an eighth source electrically coupled to the third node 254 and an eighth gate electrically coupled to the first input signal 212. A ninth transistor 246 has a ninth source electrically coupled to the second node 252, a ninth gate electrically coupled to a second input signal 214 and a ninth drain electrically coupled to the fourth drain. A tenth transistor 248 has a tenth drain electrically coupled to the third drain, a tenth gate electrically coupled to the second input signal 214 and a tenth source electrically coupled to the third node 254. The passive bias element 220 includes: a first resistor 222 electrically coupling the first drain to the first node 250, a second resistor 224 electrically coupling the second drain to the first node 250, a third resistor 226 electrically coupling the third drain to an output signal 216 and a fourth resistor 228 electrically coupling the fourth drain to the output signal 216.

In this embodiment, the first transistor 232, the third transistor 236, the fifth transistor 212, the seventh transistor 242 and the ninth transistor 246 are p-channel devices, whereas the second transistor 234, the fourth transistor 238, the sixth transistor 214, the eighth transistor 244 and the tenth transistor 248 are n-channel devices. As would be clear to one of ordinary skill in the art, other types of transistors, or other electronic amplification elements, would be freely interchangeable with the devices shown in FIG. 2.

Differential amplifier 200 is suitable as differential amplifiers 106, 108 used in receiver 100. As will be appreciated, in alternative embodiments of the present invention, any differential amplifier seeing a mismatch of input impedances at the differential inputs, such as the industry-established complementary self-biased configuration used in the prior art, may be substituted for differential amplifier 200 as used in receiver 100.

Referring back to FIG. 1, the differential inputs 102, 104 are each coupled to the differential amplifiers 106, 108 with opposing polarity. In other words, differential positive terminal 102 is coupled to the positive input 110 of differential amplifier 106 and the negative input 112 of differential amplifier 108. Similarly, differential negative terminal 104 is connected to the positive input 114 of differential amplifier 108 and the negative input 116 of differential amplifier 106. The net input impedance on differential positive terminal 102 is the sum of the input impedance of positive input 110 and negative input 112. Similarly, the net input impedance seen on differential negative terminal 104 is equal to the sum of the impedance on positive input 114 and negative input 116. If differential amplifiers 106, 108 are designed identically, then the output impedance on each of output terminals 118, 120 of differential amplifiers 106, 108, respectively, will be the same, the resulting net impedance at inputs 112 and 116 will be equal, and the net impedance at inputs 110 and 114 will be equal (not accounting for process, frequency, voltage or other variations). In summary, differential amplifiers 106, 108 are coupled in parallel with the appropriate polarity at the differential inputs such that the combined net-impedance seen at each of the input terminals 102, 104 are equivalent and the detrimental effects of a mismatched input impedance are canceled at the outputs 118, 120.

Differential amplifier outputs 118,120 are of opposite polarity and will therefore produce a receiver having a total gain of double that seen in prior-art CMOS differential amplifiers, but without increasing the total voltage swing of either differential amplifier 106, 108. The differential amplifier outputs 118, 120 are connected to differential inputs 122, 124 of the simple detector 126. Because the differential amplifier outputs 118, 120 are operating in a fairly narrow operating range, the simple detector 126 does not require significant common-mode rejection, and therefore does not need a common-bias circuit. Consequently, the inputs 122, 124 of simple detector 126 will have balanced impedance. Note that this is required to will ensure that differential amplifier outputs 118, 120 remain relatively impedance balanced. Dual-stage differential amplifiers 106, 108 present a non-distorted, amplified signal at inputs 122, 124 of simple detector 126, which detects each digital transition of the differential input signals. Thus, simple detector 126 senses a transition of the differential input signal received by receiver 100 at differential positive terminal 102 and differential negative terminal 104 through the dual-stage is differential amplifiers 106, 108. Simple detector 126 outputs a signal on output terminal 128 when such a digital signal transition occurs. As will now be appreciated, the output distortion effect seen with a mismatched impedance at the inputs of differential receivers of the prior art is eliminated when using the dual-stage differential receiver of the preferred embodiment.

Figure 3:
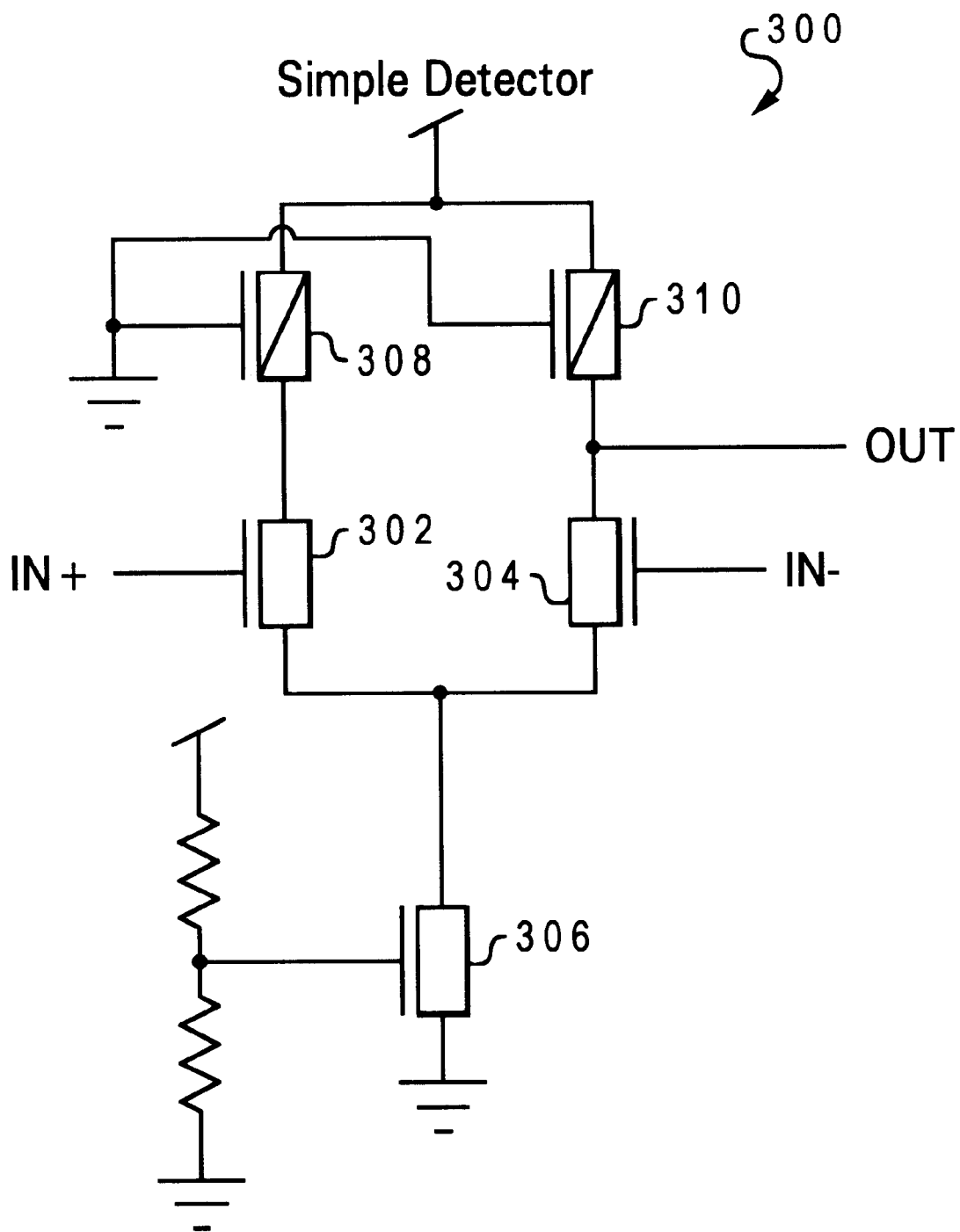
FIG. 3 shows a simple detector suitable for use in the dual-stage differential receiver-amplifier, in accordance with a preferred embodiment of the present invention.

FIG. 3 shows a simple detector suitable for use in the dual-stage differential receiver-amplifier, in accordance with a preferred embodiment of the present invention. Detector 300 receives differential inputs at the gates of n-channel metal-oxide semiconductors (NMOS) transistors 302, 304. The source terminals of NMOS transistors 302, 304 are connected to the drain terminals of NMOS transistor 306. The drain terminals of NMOS transistors 302, 304 are connected to the drain terminals of p-channel metal-oxide semiconductors (PMOS) 308, 310, respectively. As will be appreciated by those skilled in the art, a differential signal at the differential inputs (IN+, IN−) is detected, and an output signal is produced at the simple detector's output (OUT).

While the invention has been particularly shown and described with reference to a preferred embodiment, it will be understood by those skilled in the art that various changes in form and detail may be made therein without departing from the spirit and scope of the invention.

What is claimed is:

1. A differential receiver, wherein the differential receiver receives differential data signals at a differential positive terminal and a differential negative terminal, the differential receiver comprising:

a differential signal detector having a first input terminal and a second input terminal, wherein an output signal is produced on an output terminal when a differential signal is detected on the first and second input terminals; a first differential amplifier having an output terminal coupled to the first input terminal, the first differential amplifier comprising a first differential input terminal and a second differential input terminal, wherein an input impedance at the first differential input terminal of the first differential amplifier is substantially different than an input impedance of the second differential input terminal of the first differential amplifier at an input frequency of interest; and a second differential amplifier having an output terminal coupled to the second input terminal, the second differential amplifier comprising a first differential input terminal and a second differential input terminal, wherein an input impedance at the first differential input terminal of the second differential amplifier is substantially different than an input impedance of the second differential input terminal of the second differential amplifier at an input frequency of interest;

wherein, the first differential input terminal of the first differential amplifier and the second differential input terminal of the second differential amplifier are coupled to the differential positive terminal, and the second differential input terminal of the first differential amplifier and the first differential input terminal of the second differential amplifier are coupled to the differential negative terminal, wherein the resulting input impedance at the differential positive terminal is substantially equal to the resulting input impedance at the differential negative terminal.

2. The differential receiver as in claim 1, wherein the first and second differential amplifiers are self-biased complementary differential amplifiers.

3. The differential receiver as in claim 1, wherein the first input terminal is coupled to the first differential input terminal of the first differential amplifier and the second input terminal is coupled to the first differential input terminal of the second differential amplifier such that impedance mismatching occurs at the input terminals of the first and second differential amplifiers.

4. The differential receiver as in claim 1, wherein the first differential amplifier and the second differential amplifier are Complementary Metal-Oxide Semiconductor (CMOS) devices.

5. The differential receiver as in claim 1, wherein the first differential amplifier comprises:

a first transistor having a first source electrically coupled to a first voltage, a first gate electrically coupled to a first node and a first drain, the first node being a bias node;

a second transistor having a second drain, a second gate electrically coupled to the first node and a second source electrically coupled to second voltage different from the first voltage;

a first resistor electrically coupling the first drain to the first node;

a second resistor electrically coupling the second drain to the first node;

a third transistor having a third source electrically coupled to the first voltage, a third drain and a third gate electrically coupled to the first node;

a fourth transistor having a fourth drain, a fourth gate electrically coupled to the first node and a fourth source electrically coupled to the second voltage;

a third resistor electrically coupling the third drain to an output signal;

a fourth resistor electrically coupling the fourth drain to the output signal;

a fifth transistor having a fifth source electrically coupled to the first voltage, a fifth drain electrically coupled to a second node and a fifth gate electrically coupled to the first node;

a sixth transistor having a sixth drain electrically coupled to a third node, a sixth gate electrically coupled to the first node and a sixth source electrically coupled to the second voltage;

a seventh transistor having a seventh source electrically coupled to the second node, a seventh drain electrically coupled to the second drain, and a seventh gate electrically coupled to a first input signal;

an eighth transistor having an eighth drain electrically coupled to the first drain, and an eighth source electrically coupled to the third node and an eighth gate electrically coupled to the first input signal;

a ninth transistor having a ninth source electrically coupled to the second node, a ninth gate electrically coupled to a second input signal and a ninth drain electrically coupled to the fourth drain; and a tenth transistor having a tenth drain electrically coupled to the third drain, a tenth gate electrically coupled to the second input signal and a tenth source electrically coupled to the third node.

6. The differential receiver as in claim 5, wherein the first transistor, the third transistor, the fifth transistor, the seventh transistor and the ninth transistor each comprise a p-channel device.

7. The differential receiver as in claim 5, wherein the second transistor, the fourth transistor, the sixth transistor, the eighth transistor and the tenth transistor each comprise an n-channel device.

8. The differential receiver as in claim 5, wherein the second voltage is electrically coupled to a common ground.

* * * * *